US008164862B2

(12) United States Patent
Zhang et al.

(10) Patent No.: US 8,164,862 B2
(45) Date of Patent: Apr. 24, 2012

(54) SEED LAYER FOR TMR OR CPP-GMR SENSOR

(75) Inventors: Kunliang Zhang, Fremont, CA (US); Tong Zhao, Fremont, CA (US); Hui-Chuan Wang, Pleasanton, CA (US); Min Li, Dublin, CA (US)

(73) Assignee: Headway Technologies, Inc., Milpitas, CA (US)

( * ) Notice: Subject to any disclaimer, the term of this patent is extended or adjusted under 35 U.S.C. 154(b) by 1057 days.

(21) Appl. No.: 12/080,277

(22) Filed: Apr. 2, 2008

(65) Prior Publication Data

US 2009/0251829 A1 Oct. 8, 2009

(51) Int. Cl.
*G11B 5/39* (2006.01)

(52) U.S. Cl. .................. 360/324.1; 360/324.2

(58) Field of Classification Search ............... 360/324.1, 360/324.11, 324.12, 324.2
See application file for complete search history.

(56) References Cited

U.S. PATENT DOCUMENTS

| 6,275,362 | B1 * | 8/2001 | Pinarbasi ............... 360/324.12 |
| 6,788,499 | B2 * | 9/2004 | Lin et al. .................. 360/324.1 |
| 7,218,487 | B2 | 5/2007 | Hasegawa et al. |
| 7,228,619 | B2 | 6/2007 | Le |
| 7,532,442 | B2 * | 5/2009 | Gill ........................... 360/324.11 |
| 2002/0181170 | A1 * | 12/2002 | Lin et al. ................. 360/324.11 |
| 2005/0180059 | A1 * | 8/2005 | Gill ........................... 360/324.11 |
| 2007/0146928 | A1 | 6/2007 | Zhang et al. |
| 2007/0169337 | A1 | 7/2007 | Brusca et al. |
| 2007/0285847 | A1 * | 12/2007 | Lin ............................ 360/324.1 |
| 2009/0161268 | A1 * | 6/2009 | Lin ........................... 360/324.11 |
| 2010/0128400 | A1 * | 5/2010 | Lin ............................... 360/319 |

OTHER PUBLICATIONS

Co-pending US Patent HT07-011, U.S. Appl. No. 11/820,251, filed Jun. 19, 2007, "TMR or CPP Structure with Improved Exchange Properties," assigned to the same assignees as the present invention.

* cited by examiner

*Primary Examiner* — Jefferson Evans
(74) *Attorney, Agent, or Firm* — Saile Ackerman LLC; Stephen B. Ackerman

(57) ABSTRACT

A composite seed layer that reduces the shield to shield distance in a read head while improving Hex (exchange coupling field) and Hex/Hc (Hc=coercivity) is disclosed and has a SM/A/SM/B configuration in which the SM layers are soft magnetic layers, the A (amorphous) layer is made of at least one of Co, Fe, Ni, and includes one or more amorphous elements, and the B layer is a buffer layer that contacts the AFM (anti-ferromagnetic) layer in the spin valve. The SM/A/SM stack together with the S1 (bottom) shield forms an effective shield such that the buffer layer serves as the effective seed layer while maintaining a blocking temperature of 260° C. in the AFM layer. The lower SM layer may be omitted. Examples of the amorphous layer are CoFeB, CoFeZr, CoFeNb, CoFeHf, CoFeNiZr, CoFeNiHf, and CoFeNiNbZr while the buffer layer may be Cu, Ru, Cr, Al, or NiFeCr.

21 Claims, 3 Drawing Sheets

SEED LAYER FOR TMR OR CPP-GMR SENSOR

RELATED PATENT APPLICATIONS

This application is related to the following: Ser. No. 11/317,598, filing date Dec. 23, 2005; Ser. No. 11/820,251, filing date Jun. 19, 2007; both assigned to a common assignee and both of which are herein incorporated by reference in their entirety.

FIELD OF THE INVENTION

The invention relates to a high performance spin valve and a method for making the same, and in particular, to a composite seed layer that is formed as part of a bottom shield thereby reducing shield to shield spacing without compromising Hex/Hc or Hex between the anti-ferromagnetic (AFM) layer and synthetic pinned layer.

BACKGROUND OF THE INVENTION

A CPP-GMR head is considered as one promising sensor to replace the conventional CIP (current in plane) GMR head for over 200 Gb/in$^2$ recording density. In a typical CPP-GMR sensor, a bottom synthetic spin valve film stack is employed for biasing reasons and a CoFe/NiFe composite free layer is conventionally used following the tradition of CIP-GMR technology. GMR spin valve stacks have a configuration in which two ferromagnetic layers are separated by a non-magnetic conductive layer (spacer). One type of CPP-GMR sensor is called a metallic CPP-GMR that can be represented by the following configuration which has a copper spacer between the inner pinned (AP1) layer and free layer: Seed/AFM/AP2/Ru/AP1/Cu/free layer/capping layer. One of the ferromagnetic layers is a pinned layer in which the magnetization direction is fixed by exchange coupling with an adjacent anti-ferromagnetic (AFM) or pinning layer. The pinned layer may have a synthetic anti-parallel (SyAP) structure wherein an outer AP2 layer is separated from an inner AP1 layer by a coupling layer such as Ru. The second ferromagnetic layer is a free layer in which the magnetization vector can rotate in response to external magnetic fields. The rotation of magnetization in the free layer relative to the fixed layer magnetization generates a resistance change that is detected as a voltage change when a sense current is passed through the structure. In a CPP configuration, a sense current is passed through the sensor in a direction perpendicular to the layers in the stack. Alternatively, in the CIP sensor, the sense current passes through the sensor in a direction parallel to the planes of the layers in the sensor stack.

Ultra-high density (over 100 Gb/in$^2$) recording requires a highly sensitive read head. To meet this requirement, the CPP configuration is a stronger candidate than the CIP configuration which has been used in recent hard disk drives (HDDs). The CPP configuration is more desirable for ultra-high density applications because a stronger output signal is achieved as the sensor size decreases, and the magnetoresistive (MR) ratio is higher for a CPP configuration. An important characteristic of a GMR head is the MR ratio which is dR/R where dR is the change in resistance of the spin valve sensor and R is the resistance of the spin valve sensor before the change. A higher MR ratio is desired for improved sensitivity in the device and this result is achieved when electrons in the sense current spend more time within the magnetically active layers of the sensor. Interfacial scattering which is the specular reflection of electrons at the interfaces between layers in the sensor stack can improve the MR ratio and increase sensitivity.

Another type of sensor is a so-called confining current path (CCP) CPP GMR sensor where the current through the Cu spacer is limited by the means of segregating metal path and oxide formation. With a current confining (CCP) scheme, CPP GMR performance can be further improved. An example of a CCP CPP-GMR sensor has the following configuration: Seed/AFM/AP2/Ru/AP1/Cu/CCP layer/Cu/free layer/capping layer where the CCP layer is sandwiched between two copper layers.

In a CPP operation mode, a tunnel magnetoresistive (TMR) head is another candidate for realizing high sensitivity and high recording density. In this design, the non-magnetic conductive layer between the pinned layer and free layer in the GMR stack is replaced by an insulating layer such as AlO$_x$ or MgO. When the magnetoresistive element is a magnetic tunnel junction (MTJ), the tunneling (insulating) layer may be thinned to give a very low RA (<5 ohms-μm$^2$).

A MTJ element in a magnetic device such as a read head may be based on a tunneling magneto-resistance (TMR) effect wherein a stack of layers has a configuration in which two ferromagnetic layers are separated by a thin non-magnetic dielectric layer. The bottom layer in the MTJ element is typically comprised of a seed layer such as NiFeCr or a Ta/NiCr composite which promotes a (111) lattice orientation in overlying layers. Generally, an AFM layer, ferromagnetic "pinned" layer, tunnel barrier layer, ferromagnetic "free layer", and a capping layer are successively formed on the seed layer to complete the MTJ stack. The pinned layer has a magnetic moment that is fixed in the "x" direction, for example, by exchange coupling with the adjacent AFM layer that is also magnetized in the "x" direction. The thin tunnel barrier layer above the pinned layer is so thin that a current through it can be established by quantum mechanical tunneling of conduction electrons.

The free layer has a magnetic moment that is either parallel or anti-parallel to the magnetic moment in the pinned layer. The magnetic moment of the free layer may change in response to external magnetic fields and it is the relative orientation of the magnetic moments between the free and pinned layers that determines the tunneling current and therefore the resistance of the tunneling junction. When a sense current is passed through the MTJ stack in a direction perpendicular to the layers therein, a lower resistance is detected when the magnetization directions of the free and pinned layers are in a parallel state ("1" memory state) and a higher resistance is noted when they are in an anti-parallel state or "0" memory state.

One indication of good device performance is a high magnetoresistive (TMR) ratio which is dR/R where R is the minimum resistance of the MTJ element and dR is the maximum change in resistance observed by changing the magnetic state of the free layer. In order to achieve desirable properties such as a specific junction resistance x area (RA) value, a high dR/R value, and a high breakdown voltage (Vb), it is necessary to have a smooth tunnel barrier layer that is promoted by a smooth and densely packed growth, such as a (111) texture for the AFM layer, pinned layer, and seed layer. Other desirable magnetic properties for an MTJ are a small interlayer coupling field (Hin) between the pinned layer and free layer, and a strong exchange coupling field (Hex) between the AFM layer and pinned layer is important to maintain the pinned layer magnetization in a certain direction.

For better head performance, it is always desirable to have a larger Hex to ensure pinning robustness between the AFM and AP2 layers and a smaller pinning dispersion. In other words, a larger Hex/Hc ratio is needed to suppress pinning field related noise. Improvement in the exchange bias properties may be achieved by proper selection of the seed layer, AFM layer, and pinned layer. However, further optimization than heretofore achieved is necessary for ultra-high density recording heads. Moreover, for ultra-high density read head applications, thinner full film stack thickness is preferred in order to achieve high resolution and high signal to noise ratio (SNR). Since reducing the magnetic layer thickness of a pinned layer or free layer, for example, will reduce the MR ratio, a better choice would be to decrease a non-magnetic layer thickness.

In U.S. Pat. No. 7,228,619, a seed layer comprising a magnetic material is deposited on an etched gap layer. The seed layer may be a bilayer with a lower NiFe layer and an upper Cu layer.

U.S. Pat. No. 7,218,487 describes a spin valve in which the bottom layer is a non-magnetic layer including at least one of Ta, Hf, Nb, Zr, Ti, Mo, and W and an overlying seed layer is comprised of a NiFe alloy or a NiFeY alloy where Y is at least one of Cr, Rh, Ta, Hf, Nb, Zr, and Ti.

In U.S. Patent Application Publication 2007/0169337, a CoFeON seed layer is formed between a write gap layer and a second pole pedestal. A small amount of oxygen in a CoFeN layer reduces coercivity and improves writer performance.

SUMMARY OF THE INVENTION

One objective of the present invention is to increase Hex between the AFM layer and AP2 pinned layer while increasing Hex/Hc and maintaining an adequate blocking temperature for the AFM layer.

A further objective of the present invention is to reduce the effective shield to shield spacing in a read head to enable high resolution and improved signal to noise ratio.

According to the present invention, these objectives are achieved with a novel seed layer, a substantial portion of which is incorporated into the bottom shield so that bottom shield to top shield spacing is reduced compared with the prior art. In one embodiment, the seed layer is represented by a SM/A/SM/B configuration in which SM is a soft magnetic material having a high permeability, A is an amorphous layer that is either magnetic or a thin non-magnetic layer less than about 15 Angstroms thick, and B is a buffer layer. The SM/A/SM portion is preferably incorporated into the bottom (S1) shield and may be formed on a NiFe (S1) shield, for example, to provide an effective shield structure represented by NiFe/SM/A/SM. In one aspect, the buffer layer is patterned simultaneously with an overlying MTJ stack of layers comprised of an AFM layer, pinned layer, tunnel barrier, free layer, and cap layer that are sequentially formed on the buffer layer. Therefore, from a top-down view, the buffer layer has a shape essentially the same as the patterned MTJ stack.

In one embodiment, the A layer is comprised of at least one element of Co, Fe, and Ni and at least one amorphous element or alloy including B, Zr, Hf, Ta, Si, P, or Nb in which the amorphous element or alloy content is preferably less than 40 atomic %. CoFeB, CoFeZr, CoFeNiZr, CoFeHf, CoFeNiHf, CoFeTa, CoFeNiTa, CoFeNbZr, and CoFeNiNbZr are examples of the thin amorphous A layer that provides a smooth surface for growing a smooth MTJ stack of layers thereon. The SM layers may be NiFe or NiFeCo and the lower SM layer may not necessarily have the same composition as the upper SM layer. Essentially, the buffer layer is a seed layer and promotes a smooth and uniform crystal structure in overlying spin valve layers. The buffer layer may be comprised of Ru, Cu, Al, NiFeCr, or the like. The thickness of the buffer layer may be decreased to 5 Angstroms, substantially less than a typical seed layer thickness, without negatively impacting the blocking temperature of the overlying AFM layer. Furthermore, a higher Hex/Hc ratio is realized compared with a prior art Ta/Ru seed layer. Optionally, the lower SM layer is omitted and the A layer is formed directly on a NiFe bottom S1 shield layer to provide an effective bottom shield having a NiFe/A/SM configuration and a A/SM/B seed layer.

In a second embodiment, the tunnel barrier layer of the first embodiment is replaced with a spacer layer represented as Cu/CCP/Cu where CCP is a current confining path layer made of an insulator with metal paths formed therein. This configuration is considered to be one example of a giant magnetoresistive (GMR) spin valve. Preferably, the GMR element has a current perpendicular to path (CPP) configuration.

The present invention also encompasses a method of forming the seed layer and overlying MTJ element comprised of the buffer layer. The NiFe S1 shield layer and SM layers may be electroplated. The A layer and all layers in the MTJ stack including the buffer layer are preferably formed in a sputter deposition system that includes one or more sputter deposition chambers and at least one oxidation chamber. In the TMR embodiment involving a tunnel barrier, an AlOx, MgO, AlTiOx, or TiOx layer may be employed as the tunnel barrier layer. In one aspect, the metal in the tunnel barrier layer is deposited in a sputter deposition chamber and then oxidized in an oxidation chamber by a natural oxidation (NOX) or radical oxidation (ROX) method. In the GMR-CPP embodiment, the current path through the Cu/CCP/Cu spacer is limited by means of segregated metal path and oxide formation that is fabricated by a known method. After all layers in the MTJ element are laid down on the substrate, a conventional patterning and etching sequence may then be followed to define the shape of the MTJ element. Subsequently, an insulation layer may be deposited on either side of the MTJ and a top shield is formed on the insulation layer and top surface of the MTJ element in the TMR embodiment. A dielectric layer and a hard bias layer may be formed adjacent to the sidewalls of the MTJ element according to the GMR-CPP embodiment.

DETAILED DESCRIPTION OF THE INVENTION

Figure 1:
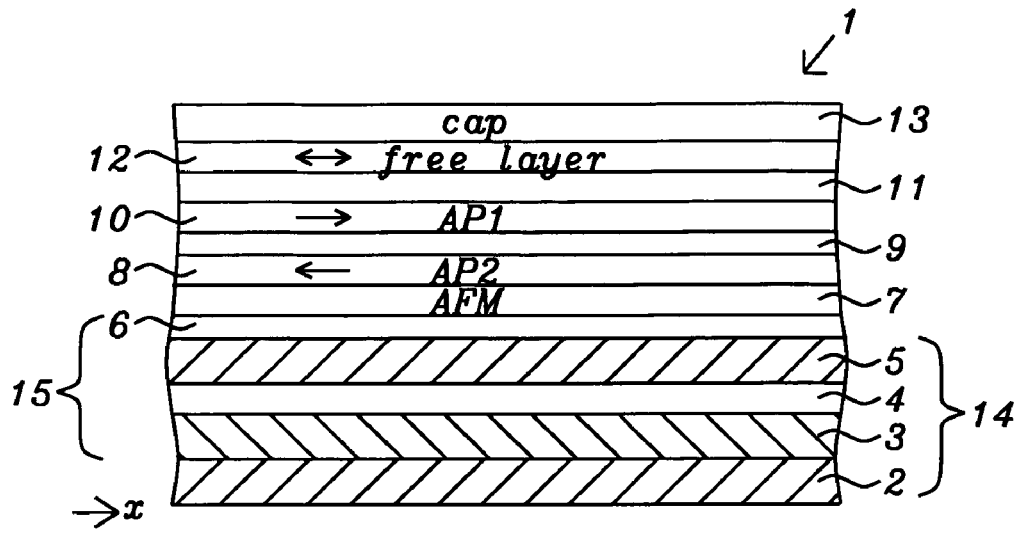
FIG. 1 is a cross-sectional view of a MTJ stack of layers formed on a composite seed layer according to one embodiment of the present invention.

The present invention is a composite seed layer for a magnetoresistive element in a read head and includes at least one soft magnetic layer, an amorphous layer that may be either magnetic or non-magnetic, and a buffer layer that contacts the AFM layer in the MTJ or GMR-CPP stack. The drawings are provided by way of example and are not intended to limit the scope of the invention. Although the drawings depict a bottom spin valve structure, the present invention also encompasses a dual spin valve configuration as appreciated by those skilled in the art. The present invention is also a method of making a composite seed layer structure in a read head.

It is known in the art that to achieve high performance read heads based on ultra-high density designs, a thinner MTJ stack between the bottom S1 shield and upper S2 shield is preferred in order to realize high resolution and high signal to noise ratio (SNR). The present invention provides a novel seed layer configuration that enables the effective shield to shield distance to be minimized without thinning any magnetic layers. In a previous Headway patent application HT05-041 which is herein incorporated by reference in its entirety, the inventors demonstrated a substantial improvement in exchange properties (higher Hex, lower Hc) by employing a Ta/Ru seed layer in a MTJ stack instead of a conventional Ta/NiCr seed layer. Moreover, the overall MTJ stack thickness was reduced because of employing a thinner seed layer. The inventors have also shown in Headway patent application HT07-011 that insertion of a thin CoFeB layer at the seed layer/AFM layer interface can further improve exchange properties. The present invention provides an additional improvement in which shield to shield distance is reduced without sacrificing the aforementioned improvement in exchange properties. In fact, we have discovered a seed layer configuration that reduces the shield to shield distance while increasing Hex and the Hex/Hc ratio compared with a prior art Ta/Ru seed layer.

According to the present invention, formation of an amorphous layer with a superfine grain or microcrystalline structure on the bottom S1 shield will mitigate the effect of the large S1 shield grain size on MTJ performance. It is well known that the S1 shield layer has considerable roughness as a result of electrodeposition and retains a rough surface even after a planarization using a chemical mechanical polish (CMP) process. In the prior art, a single seed layer or a Ta/Ru composite, for example, is disposed on the S1 shield to form a smooth surface that promotes smooth and uniform overlying layers in a spin valve stack. However, a conventional seed layer is generally about 70 Angstroms thick which represents a considerable contribution to the total distance between the S1 and S2 shields. An improvement is desired that enables higher read head performance by minimizing the thickness of at least one non-magnetic layer between the two shields.

By incorporating a portion of the composite seed structure in the effective shield according to the present invention, the effective seed layer thickness may be reduced by at least 30 to 35 Angstroms compared with a conventional design. In other words, the present invention takes advantage of inserting an amorphous magnetic layer in the bottom shield which reduces the thickness needed for the effective seed layer that contacts the AFM layer in the MTJ stack. The novel seed layer structure includes a sputter deposited NiFe layer on the amorphous layer and a buffer layer that functions as the effective seed layer on the sputter deposited NiFe layer.

Referring to FIG. 1, a view is shown from a cross-section along an air bearing surface (ABS) in a partially formed read head 1 having an effective bottom shield 14. The effective bottom shield 14 is comprised of a lower S1 shield layer 2 that may be electroplated permalloy (NiFe), for example. Above the S1 shield layer 2 is a composite seed layer 15 formed according to one embodiment of the present invention. Composite seed layer 15 may be represented by a SM/A/SM/B configuration in which SM refers to soft magnetic layers 3 and 5, A is an amorphous layer 4 that may be magnetic or a thin non-magnetic layer less than about 15 Angstroms thick, and B is a buffer layer 6.

The SM layers 3, 5 may be comprised of NiFe, NiFeCo, FeCo, or other soft magnetic materials with high permeability and the lower SM layer may have a different composition than the upper SM layer. Preferably, the Ni content in the NiFe composition is from about 50 to 90 atomic %. The lower SM layer 3 is disposed on the top surface of the S1 shield layer 2 and has a thickness of 1 to 100 Angstroms. Above the lower SM layer 3 is an amorphous "A" layer 4 with a thickness from 1 to 30 Angstroms that is comprised of at least one element of Co, Fe, and Ni and at least one amorphous element or alloy including one or more of B, Zr, Hf, Ta, Si, P, and Nb in which the amorphous element or alloy content in the A layer is preferably less than 40 atomic % but is not limited to less than 40 atomic %. For example, the thin amorphous layer 4 may be comprised of CoFeB, CoFeZr, CoFeNiZr, CoFeHf, CoFeNiHf, CoFeTa, CoFeNiTa, CoFeNbZr, and CoFeNiNbZr and provides a smooth surface for growing a smooth spin valve stack of layers thereon.

It should be understood that electroplated NiFe typically has a large grain size and that formation of an amorphous layer 4 with a small grain size will promote a smooth and uniform crystal structure in the overlying spin valve stack of layers 6-13 that enhances the MR ratio in the read head 1. Those skilled in the art will appreciate that an amorphous layer alloy containing a large content of one or more non-magnetic elements may still exhibit a certain amount of magnetism, especially when grown on crystalline underlayers. SM layers 3, 5 are sputter deposited in order to provide a smaller grain size than would be produced by electroplating. The upper SM layer 5 promotes a fcc (111) crystal structure in overlying MTJ layers which is beneficial in providing enhanced Hex between the AFM layer 7 and AP2 layer 8.

The buffer layer 6 is formed on the SM layer 5 and has a thickness from 5 to 30 Angstroms, and preferably about 10 Angstroms. Buffer layer 6 serves as the effective seed layer for the overlying stack of spin valve layers 7-13 and may be comprised of Ru, Cu, Al, NiFeCr or the like. The buffer layer 6 preferably has a fcc or hcp structure that matches well with the crystal orientations in the SM layer 5 and AFM layer 7 and prevents magnetic coupling between the aforementioned layers. At thicknesses less than 5 Angstroms, the buffer layer 6 is less effective in preventing undesirable coupling between the SM layer 5 and AFM layer 7. On the other hand, if the buffer layer 6 is greater than about 30 Angstroms thick, the advantage in minimizing the S1 to S2 shield distance is partially lost.

An AFM layer 7 is formed on the buffer layer 6 and is preferably comprised of IrMn with a thickness of about 50 to 75 Angstroms. Alternatively, the AFM layer 7 may be made of MnPt, NiMn, OsMn, RuMn, RhMn, PdMn, RuRhMn, or PtPdMn and is used to pin the magnetization direction in an overlying AP2 layer 8.

In the exemplary embodiment, there is a synthetic anti-parallel (SyAP) pinned layer comprised of a lower AP2 ferromagnetic layer 8, a middle coupling layer 9, and an upper AP1 ferromagnetic layer 10 formed on the AFM layer 7. Note that the magnetic moment of the AP2 layer 8 is pinned in a direction anti-parallel to the magnetic moment of the AP1 layer 10. The AP2 layer 8 may be comprised of CoFe with a composition of about 75 to 90 atomic % cobalt and has a thickness of about 20 to 50 Angstroms. The AP2 layer 8 may be slightly thicker than the AP1 layer 10 to produce a small net magnetic moment for the SyAP pinned layer structure. Exchange coupling between the AP2 layer and the AP1 layer is facilitated by a coupling layer 9 that is preferably comprised of Ru with a thickness of about 7.5 Angstroms. Optionally, Rh or Ir may be employed as the coupling layer 9. In one embodiment, the AP1 layer 10 is comprised of CoFe with a composition of about 25 to 50 atomic % Fe and a thickness of 10 to 25 Angstroms. Optionally, the AP1 layer 10 may be a composite layer that includes a thin nano-oxide layer (NOL) such as FeTaO or CoFeO sandwiched between CoFe layers. The nano-oxide layer is employed to increase smoothness of the AP1 layer. In another embodiment, the AP1 layer 10 may be a laminated film comprised of CoFe and Cu layers with a [CoFe/Cu]$_n$/CoFe configuration where n is 2 or 3. The present invention also anticipates an AP1 layer 10 that is a composite of CoFeB and CoFe layers.

In one embodiment that represents a TMR configuration, there is a tunnel barrier layer 11 disposed on the AP1 layer that is comprised of an oxidized metal such as AlOx, MgO, AlTiOx, or TiOx. In one embodiment, a 5 to 6 Angstrom thick Al layer is deposited on the AP1 layer 10 and is subsequently oxidized by an in-situ radical oxidation (ROX) that involves a plasma oxidation process in which a grid-like cap is placed between an upper ionizing electrode and a substrate surface (Al layer) in an oxidation chamber of the sputter deposition tool that is used to deposit the Al layer. The resulting AlO$_X$ layer has a thickness of about 7 to 11 Angstroms and has excellent smoothness and uniformity because of the smooth and densely packed seed layer 15 and a (111) crystal structure in underlying AFM layer 7 and SyAP pinned layer. Alternatively, the tunnel barrier layer 11 may be comprised of MgO which is formed by first depositing a Mg layer (not shown) about 8 Angstroms thick on the AP1 layer 10. Then a ROX or natural oxidation (NOX) process is performed to oxidize the Mg layer. Subsequently, a second Mg layer about 4 Angstroms thick is deposited on the oxidized Mg layer to result in a Mg/MgO/Mg tunnel barrier layer 11. The Mg/MgO/Mg configuration formed by the method described herein has been found to provide better RA uniformity than sputter depositing a MgO tunnel barrier layer. Depending on NOX or ROX process conditions, the tunnel barrier layer may also be represented by MgO/Mg. Furthermore, subsequent annealing conditions employed after all layers in the spin valve stack are formed may result in oxidation of the upper Mg layer in the tunnel barrier to give a final composition of the tunnel barrier layer 11 represented by MgO.

Above the tunnel barrier layer 11 is a free layer 12 that may be comprised of CoFe or CoFeB. Alternatively, the free layer 12 may be a composite in which a bottom layer made of CoFe is formed on the tunnel barrier layer 11 and a NiFe layer is disposed on the CoFe layer. The present invention also anticipates that other soft magnetic materials may be employed as the free layer 19 in the read head 1. Free layer 12 may have a magnetic moment in a direction parallel or anti-parallel to that of AP1 layer 10.

At the top of the MTJ stack of layers is a capping layer 13 that may be a composite comprised of a lower Ru layer on the free layer 12 and a Ta layer on the Ru layer. Optionally, the capping layer 13 may be comprised of a composite such as Ru/Ta/Ru or other suitable capping layer materials used by those skilled in the art.

Figure 2:
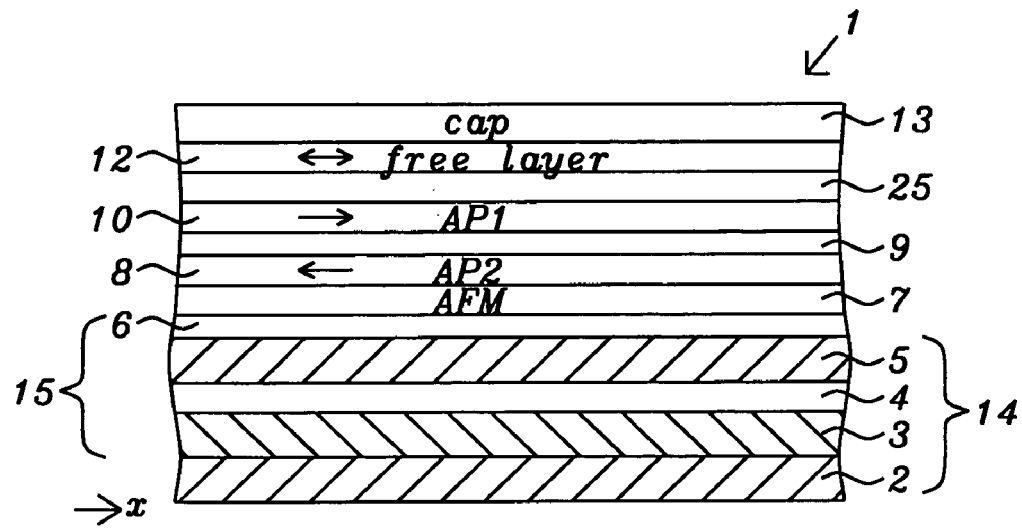
FIG. 2 is a cross-sectional view of a stack of layers in a GMR-CPP spin valve that are formed on a composite seed layer according to a second embodiment of the present invention.

Referring to FIG. 2, a second embodiment of the present invention is shown that represents a giant magnetoresistive (GMR) sensor. The GMR sensor 1 has essentially the same structure as shown in the TMR embodiment except the tunnel barrier layer 11 is replaced with a conductive spacer 25.

The non-magnetic spacer 25 is formed on the AP1 layer 10 and may be made of Cu with a thickness of about 20 to 50 Angstroms. In an alternative embodiment, the non-magnetic spacer 25 may have a CCP configuration in which the current path through a copper spacer is limited by means of segregating metal path and oxide formation. One CCP configuration that is well known in the industry is represented by Cu/CCP/Cu where a CCP layer made of an alumina template and segregated copper paths therein is sandwiched between two thin Cu layers. In one aspect, the lower Cu layer is about 2 to 8 Angstroms thick and the upper Cu layer has a thickness between 2 and 6 Angstroms. The CCP layer has a thickness from about 6 to 10 Angstroms and may be derived from AlCu and a portion of the lower Cu layer that are subjected to a plasma ion treatment followed by an ion assisted oxidation process.

The present invention also encompasses an annealing step after all of the spin valve layers have been deposited. For example, in the GMR-CPP embodiment, the stack comprised of seed layer 15, AFM layer 7, SyAP pinned layer (layers 8-10), spacer 25, free layer 12, and capping layer 13 may be annealed by applying a magnetic field of about 10K Oe in magnitude along a certain axis for about 0.5 to 20 hours at a temperature between 220° C. and 350° C. Likewise, in the TMR embodiment (FIG. 1), the MTJ stack of layers may be annealed using the aforementioned conditions but with a preferred temperature in the 250° C. to 350° C. range.

Figure 3:
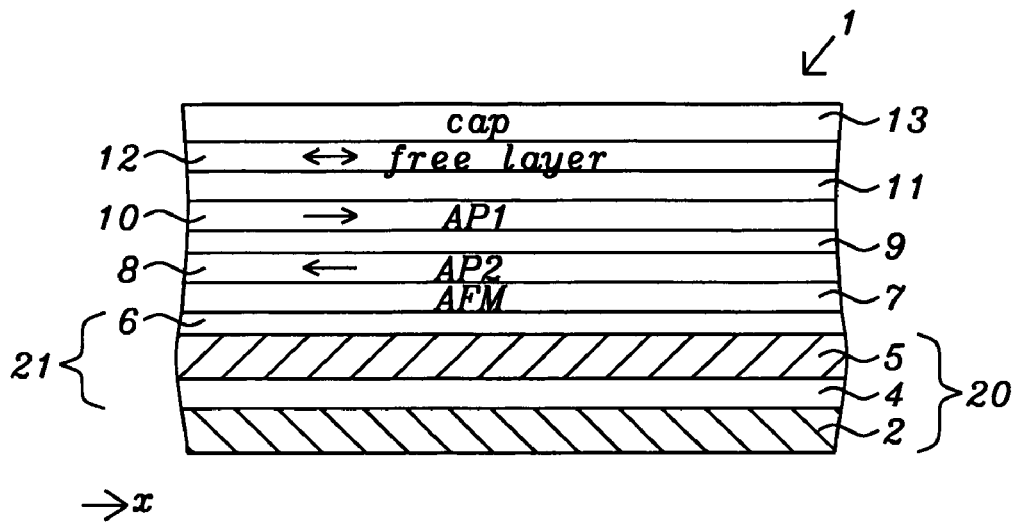
FIG. 3 is a cross-sectional view of a MTJ stack of layers formed on a composite seed layer that includes a lower amorphous layer, a middle soft magnetic layer, and an upper buffer layer according to another embodiment of the present invention.

Referring to FIG. 3, a third embodiment of the present invention is depicted that relates to a TMR head 1 that is essentially the same as described in FIG. 1 except the lower SM layer 3 is omitted. In this case, the amorphous layer 4 is formed directly on the S1 shield layer 2. The effective bottom shield 20 is now comprised of S1 shield layer 2, amorphous layer 4, and SM layer 5. Seed layer 21 is comprised of a lower amorphous layer 4, a middle SM layer 5, and buffer layer 6. Effective shield 20 to S2 shield (not shown) distance remains the same as effective shield 14 to S2 shield distance in the first two embodiments (FIGS. 1-2).

The present invention also anticipates a fourth embodiment (not shown) wherein the tunnel barrier layer 11 in FIG. 3 is replaced by a non-magnetic spacer 25. Thus, the fourth embodiment has the same effective shield 20 and composite seed layer 21 as in the third embodiment but the TMR sensor in the third embodiment becomes a GMR-CPP sensor in the fourth embodiment. Buffer layer 6 is retained as the effective seed layer for the overlying stack of spin valve layers.

Figure 4:
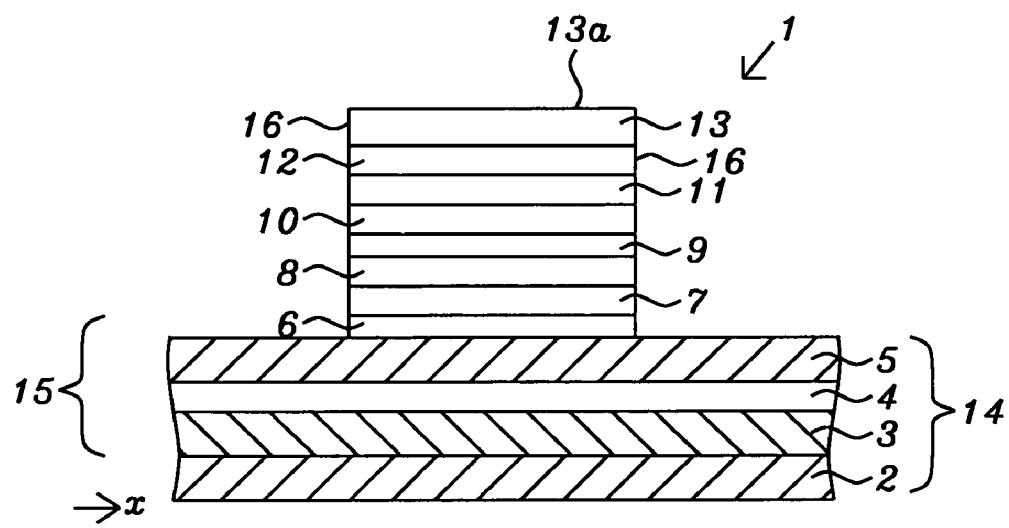
FIG. 4 is a cross-sectional view of a patterned MTJ stack including a bottom buffer layer formed on a composite shield comprised of upper and lower soft magnetic layers and a middle amorphous layer according to one embodiment of the present invention.

Referring to FIG. 4, the present invention also encompasses a method of making a read head having a TMR sensor element or a GMR-CPP sensor element as described herein. As mentioned previously, the S1 shield 2 is typically electrodeposited by a conventional method. SM layers 3, 5 as well as amorphous layer 4 and all layers in the MTJ stack 6-13 may be laid down in a sputter deposition system. For instance, layers 3-13 may be formed in an Anelva C-7100 thin film sputtering system or the like which typically includes three physical vapor deposition (PVD) chambers each having five targets, an oxidation chamber, and a sputter etching chamber. At least one of the PVD chambers is capable of co-sputtering. Typically, the sputter deposition process involves an argon sputter gas and the targets are made of metal or alloys to be deposited on a substrate. All of the aforementioned layers may be formed after a single pump down of the sputter system to enhance throughput. It should be understood that alloys may be deposited by co-sputtering each of the individual elements, or by co-sputtering one or more alloys, or by co-sputtering one or more alloys with one or more individual elements as targets.

The present invention also encompasses an annealing step after all of the spin valve layers have been deposited. In the TMR embodiments, the MTJ stack may be annealed by applying a magnetic field of about 10K Oe in magnitude along a certain axis for about 0.5 to 20 hours at a temperature between 250° C. and 350° C. Similar conditions may be employed in the GMR-CPP embodiments except the preferred temperature range for annealing is from 220° C. to 350° C.

In one embodiment, the MTJ stack of layers 6-13 may be patterned to form a plurality of MTJ elements by coating a photoresist (not shown) on the top surface 13a. After patternwise exposure through a mask, the photoresist layer is developed to generate islands in the desired shape of the MTJ elements. For example, the islands may have an oval shape or another rounded shape from a top view perpendicular to the plane of the substrate. Thereafter, the photoresist is used as an etch mask while a reactive ion etch process is performed to transfer the pattern in the photoresist through the stack of layers 6-13. The photoresist layer is stripped to leave a plurality of MTJ elements each having a top surface 13a. Alternatively, a hard mask made of Ta or the like may be deposited on the top surface 13a before the photoresist patterning and etching sequence. In this case, the photoresist serves only as an etch mask for transferring the pattern through the hard mask. Then the photoresist layer is stripped and the hard mask serves as the mask for transferring the pattern through the MTJ stack of layers 6-13. In still another embodiment, the etch process stops on the buffer layer 6 which remains unpatterned.

Figure 5:
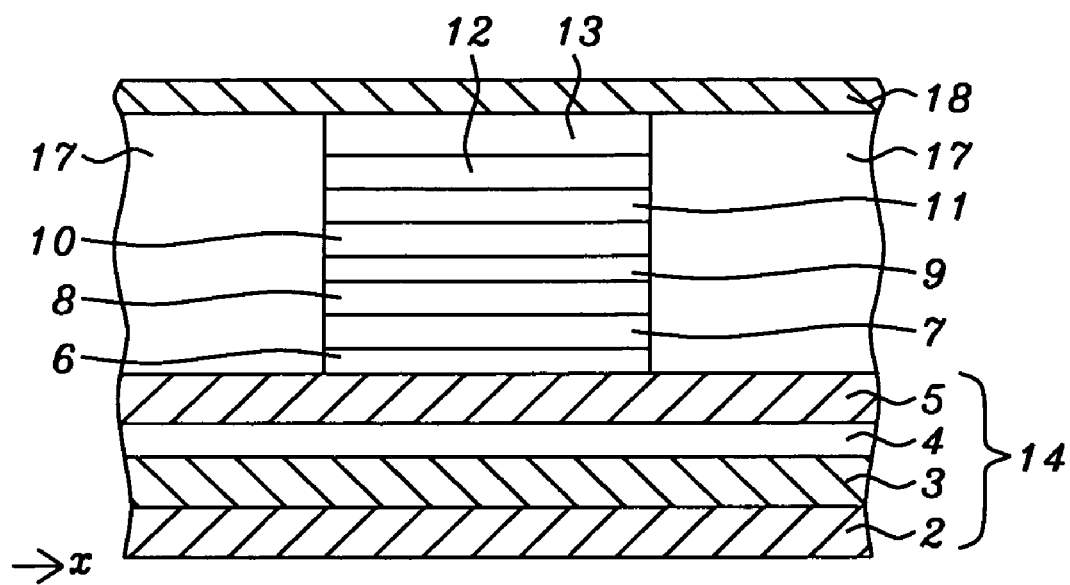
FIG. 5 is a cross-sectional view of the patterned MTJ stack in FIG. 2 after an insulation layer is formed adjacent to the MTJ and a top shield is fabricated on the cap layer according to a TMR sensor embodiment of the present invention.

Referring to FIG. 5, the read head is completed by forming an insulation layer 17 adjoining the sidewalls of the MTJ element comprised of layers 6-13. The insulation layer 17 becomes coplanar with the cap layer 13 following a CMP process. Thereafter a top (S2) shield 18 is formed on the cap layer 13 by a conventional method.

Those skilled in the art will appreciate that the steps outlined with respect to FIGS. 4 and 5 may also be applied to form a read head comprised of a GMR-CPP element where tunnel barrier layer 11 is replaced by a non-magnetic spacer 25 as described previously. In this embodiment, the spin valve element may be formed by using a photoresist patterning and etch sequence as mentioned earlier. Once the GMR-CPP sensor element is formed (not shown), an insulation layer is deposited on the effective shield and along the sidewalls of the GMR-CPP sensor element. Optionally, a seed layer such as TiW, Cr, CrTi, or CrMo may be formed on the insulation layer. Next, a hard bias layer (not shown) which may be comprised of CoCrPt or FePt is deposited on the insulation layer (or seed layer) by an ion beam deposition (IBD) or PVD process. In an alternative embodiment, a soft magnetic underlayer such as NiFe, CoFe, CoNiFe, FeTaN, or FeAlN is formed on a seed layer to promote good lattice matching between the seed layer and hard bias layer. Thereafter, a second insulation layer is deposited on the first insulation layer and on the hard bias layer with a CVD or PVD method, for example. A planarization step such as a CMP process may be employed to make the second insulation layer with cap layer 13. An upper shield 18 is then disposed on the capping layer and on the second insulation layer. The upper shield may be a composite layer such as Ta/NiFe as appreciated by those skilled in the art.

The advantages of the GMR-CPP embodiments are the same as for the TMR embodiments in that the composite seed layer having a SM/A/SM/B or A/SM/B configuration improves the exchange properties of the AFM layer and AP2 pinned layer in the spin valve while simultaneously reducing the S1 to S2 shield distance compared with the prior art. As a result, a larger Hex/Hc ratio is achieved that reduces the amount of so-called "popcorn noise" in the device and a better signal to noise ratio is realized because of minimizing the shield to shield distance. Furthermore, less pin dispersion is observed which leads to a more stable device.

Comparative Example 1

An experiment was conducted to demonstrate the improved performance of a spin valve stack of layers comprised of a composite seed layer as described herein. The stack of layers includes a composite seed layer, IrMn AFM layer, AP2 pinned layer and capping layer that were sequentially formed on a S1 shield layer made of NiFe. Note that the Ru coupling layer, AP1 layer, spacer or tunnel barrier, and free layer in a typical spin valve stack are not necessary to demonstrate the effect on Hex and Hc in this experiment. However, those skilled in the art will appreciate that the benefits observed for the composite seed layer in the abbreviated spin valve stack shown in Table 1 will fully translate to a full spin valve stack in a GMR-CPP sensor or TMR sensor structure. In this example, the reference seed layer in row 1 of Table 1 has a 20 Angstrom thick lower Ta layer and a 20 Angstrom thick Ru upper layer, the IrMn AFM layer has a thickness of 70 Angstroms, the AP2 layer is CoFe with a Fe content of 25 atomic % and a 23 Angstrom thickness, and the capping layer has a 10 Angstrom thick Ru lower layer and a 50 Angstrom thick Ta upper layer. Rows 2 and 3 in Table 1 are spin valve stacks similar to those in row 1 except the reference seed layer is replaced with a composite seed layer according to the present invention. In rows 2 and 3, the NiFe layers have a $Ni_{80}Fe_{20}$ composition, and the CoFeB amorphous layer has a $Co_xFe_yB_z$ composition where x=40 atomic %, y=40 atomic %, and z=20 atomic %. All stacks were annealed at either 250° C. or 280° C. for about 5 hours while applying a 10000 Oe magnetic field along a certain axis.

TABLE 1

Exchange properties for IrMn/AP2 structures with various seed layers

| Seed/AFM/AP2 configuration | Hex (Oe) | Hc (Oe) | Hex/Hc | Tb (° C.) |
|---|---|---|---|---|
| Ta20/Ru20/IrMn70/CoFe(25%)23 | 1939 | 291 | 6.7 | 260 |
| NiFe20/CoFeB10/NiFe20/Ru10/IrMn70/CoFe(25%)23 | 2044 | 218 | 9.4 | 260 |
| NiFe20/CoFeB10/NiFe20/Ru5/IrMn70/CoFe(25%)23 | 2015 | 259 | 7.8 | 260 |

Note that with the composite seed layers in rows 2 and 3, the effective seed layer thickness can be reduced to 5 Angstroms since the NiFe/CoFeB/NiFe portion of the composite seed layer is included in the effective bottom shield. At the same time, exchange properties such as Hex and Hex/Hc are improved over the conventional configuration in row 1. Moreover, the blocking temperature is maintained at 260° C. with the new seed layer. This result represents a significant advantage over prior art seed layers where the AFM (IrMn) blocking temperature is lowered if the seed layer becomes too thin and grain size becomes too small.

Overall, better head performance is realized because a higher Hex and larger Hex/Hc ratio can be achieved while maintaining blocking temperature and reducing the shield to shield distance. We anticipate that the TMR ratio or MR ratio in the GMR-CPP embodiments will not be affected since only the seed layer has been modified and the magnetic layers that are responsible for producing a high magnetoresistive effect remain unchanged.

While this invention has been particularly shown and described with reference to, the preferred embodiment thereof, it will be understood by those skilled in the art that various changes in form and details may be made without departing from the spirit and scope of this invention.

We claim:

1. A composite seed layer formed on a S1 shield in a read head, comprising:
   (a) a first soft magnetic (SM) layer formed on the S1 shield;
   (b) an amorphous layer formed on the first SM layer;
   (c) a second SM layer formed on the amorphous layer; and
   (d) a buffer layer formed on the second SM layer, said buffer layer contacts an anti-ferromagnetic (AFM) layer in a spin valve stack within the read head, and the first and second SM layers together with the amorphous layer and S1 shield form an effective shield in the read head.

2. The composite seed layer of claim 1 wherein the first and second SM layers are comprised of NiFe, NiFeCo, CoFe, or another soft magnetic material having a high permeability.

3. The composite seed layer of claim 1 wherein the first SM layer has a thickness between about 1 and 100 Angstroms and the second SM layer has a thickness between about 10 and 100 Angstroms.

4. The composite seed layer of claim 1 wherein the amorphous layer has a thickness between about 1 and 30 Angstroms and is comprised of at least one of Co, Fe, and Ni and at least one amorphous element or alloy including one or more of B, Zr, Hf, Ta, Si, P, and Nb in which the amorphous element or alloy content in the amorphous magnetic layer is less than about 40 atomic %.

5. The composite seed layer of claim 1 wherein the buffer layer has a thickness from about 5 to 30 Angstroms and is comprised of Ru, Cu, Al, or NiFeCr.

6. The composite seed layer of claim 1 wherein the spin valve stack is formed in a TMR sensor and includes a tunnel barrier layer made of MgO, AlOx, AlTiOx, or TiOx, or is formed in a GMR-CPP sensor and includes a spacer layer comprised of Cu or a current confining metal path (CCP) structure.

7. A composite seed layer formed on a S1 shield in a read head, comprising:
   (a) an amorphous layer formed on the S1 shield;
   (b) a soft magnetic (SM) layer formed on the amorphous layer; and
   (c) a buffer layer formed on the SM layer, said buffer layer contacts an AFM layer in a spin valve stack within the read head, and the SM layer together with the amorphous layer and S1 shield form an effective shield in the read head.

8. The composite seed layer of claim 7 wherein the SM layer is comprised of NiFe, NiFeCo, CoFe, or another soft magnetic material having a high permeability and has a thickness between about 10 and 100 Angstroms.

9. The composite seed layer of claim 7 wherein the amorphous layer has a thickness between about 1 and 30 Angstroms and is comprised of at least one of Co, Fe, and Ni and at least one amorphous element or alloy including one or more of B, Zr, Hf, Ta, Si, P, and Nb in which the amorphous element or alloy content in the amorphous layer is less than about 40 atomic %.

10. The composite seed layer of claim 7 wherein the buffer layer has a thickness from about 5 to 30 Angstroms and is comprised of Ru, Cu, Al, or NiFeCr.

11. The composite seed layer of claim 7 wherein the spin valve stack is formed in a TMR sensor and includes a tunnel barrier layer made of MgO, AlOx, AlTiOx, or TiOx, or is formed in a GMR-CPP sensor and includes a spacer layer comprised of Cu or a current confining metal path (CCP) structure.

12. A method of forming a TMR sensor, comprising:
   (a) providing a bottom (S1) shield;
   (b) forming a composite seed layer on the S1 shield wherein said composite seed layer is comprised of a first soft magnetic (SM) layer, an amorphous layer, a second soft magnetic (SM) layer, and a buffer layer that are sequentially formed on the S1 shield; and
   (c) forming a spin valve stack of layers on the composite seed layer wherein the spin valve stack includes a tunnel barrier layer.

13. The method of claim 12 wherein the layers in the composite seed layer and in the spin valve stack are formed in a sputter deposition tool.

14. The method of claim 12 wherein the first and second SM layers are comprised of NiFe, NiFeCo, CoFe, or another soft magnetic material having a high permeability, said first SM layer has a thickness between 0 and about 100 Angstroms and said second SM layer has a thickness from about 10 to 100 Angstroms.

15. The method of claim 12 wherein the amorphous layer has a thickness between about 1 and 30 Angstroms and is comprised of at least one of Co, Fe, and Ni and at least one amorphous element or alloy including one or more of B, Zr, Hf, Ta, Si, P, and Nb in which the amorphous element or alloy content in the amorphous layer is less than about 40 atomic %.

16. The method of claim 12 wherein the buffer layer has a thickness from about 5 to 30 Angstroms and is comprised of Ru, Cu, Al, or NiFeCr.

17. A method of forming a GMR-CPP sensor, comprising:
   (a) providing a bottom (S1) shield;
   (b) forming a composite seed layer on the S1 shield wherein said composite seed layer is comprised of a first soft magnetic (SM) layer, an amorphous layer, a second soft magnetic (SM) layer, and a buffer layer that are sequentially formed on the S1 shield; and
   (c) forming a spin valve stack of layers on the composite seed layer wherein the spin valve stack includes a Cu spacer or a spacer comprised of a current confining path metal layer.

18. The method of claim 17 wherein the layers in the composite seed layer and in the spin valve stack are formed in a sputter deposition tool.

19. The method of claim 17 wherein the first and second SM layers are comprised of NiFe, NiFeCo, CoFe, or another soft magnetic material having a high permeability, said first SM layer has a thickness between 0 and about 100 Angstroms and said second SM layer has a thickness from about 10 to 100 Angstroms.

20. The method of claim 17 wherein the amorphous layer has a thickness between about 1 and 30 Angstroms and is comprised of at least one of Co, Fe, and Ni and at least one amorphous element or alloy including one or more of B, Zr, Hf, Ta, Si, P, and Nb in which the amorphous element or alloy content in the amorphous layer is less than about 40 atomic %.

21. The method of claim 17 wherein the buffer layer has a thickness from about 5 to 30 Angstroms and is comprised of Ru, Cu, Al, or NiFeCr.

* * * * *